US011730042B2

(12) United States Patent
Miyamoto et al.

(10) Patent No.: US 11,730,042 B2
(45) Date of Patent: Aug. 15, 2023

(54) DISPLAY DEVICE INCLUDING WIRINGS ELECTRICALLY CONNECTING OXIDE CONDUCTIVE LAYER AND SENSOR ELECTRODE

(71) Applicant: Japan Display Inc., Tokyo (JP)

(72) Inventors: Mitsuhide Miyamoto, Tokyo (JP); Yuko Matsumoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/545,002

(22) Filed: Dec. 8, 2021

(65) Prior Publication Data

US 2022/0093695 A1  Mar. 24, 2022

Related U.S. Application Data

(63) Continuation of application No. 16/841,746, filed on Apr. 7, 2020, now Pat. No. 11,227,901, which is a
(Continued)

(30) Foreign Application Priority Data

Oct. 19, 2017 (JP) ................................ 2017-202379

(51) Int. Cl.
*H01L 27/14* (2006.01)
*H01L 33/42* (2010.01)
(Continued)

(52) U.S. Cl.
CPC ........... *H10K 59/40* (2023.02); *H10K 50/844* (2023.02); *H10K 59/124* (2023.02);
(Continued)

(58) Field of Classification Search
CPC ............... H01L 27/323; H01L 27/3258; H01L 27/3276; H01L 27/14678; H01L 33/44; H01L 33/42; H01L 51/0097; H01L 51/5253; H01L 51/5234; H01L 2251/5338; H01L 2251/301; G02F 1/133305; G06F 3/0443; G06F 3/0446; G06F 3/04164;
(Continued)

(56) References Cited

U.S. PATENT DOCUMENTS

2015/0014681 A1\* 1/2015 Yamazaki ........... H01L 27/1266
257/43
2015/0144920 A1\* 5/2015 Yamazaki ............. G06F 3/0445
257/40
(Continued)

*Primary Examiner* — Ida M Soward
(74) *Attorney, Agent, or Firm* — Michael Best & Friedrich LLP

(57) ABSTRACT

The display device includes a substrate, a display region arranged on the substrate and including a plurality of pixels, a first wiring provided on the substrate, an insulating layer overlapping a portion of the first wiring, an oxide conductive layer provided on the first wiring and electrically connected to the first wiring, a sealing layer overlapping the display region and at least an end of the oxide conductive layer and sealing the plurality of pixels, a sensor electrode provided on the sealing layer and overlapping the display region, and a second wiring passing over the at least end of the oxide conductive layer provided with the sealing layer and electrically connecting the sensor electrode and the oxide conductive layer.

10 Claims, 19 Drawing Sheets

Related U.S. Application Data continuation of application No. PCT/JP2018/032548, filed on Sep. 3, 2018.

(51) Int. Cl.
| | | |
|---|---|---|
| *H01L 33/44* | (2010.01) | |
| *G02F 1/13* | (2006.01) | |
| *G06F 3/044* | (2006.01) | |
| *G09F 9/00* | (2006.01) | |
| *H10K 59/40* | (2023.01) | |
| *H10K 50/844* | (2023.01) | |
| *H10K 59/124* | (2023.01) | |
| *H10K 59/131* | (2023.01) | |
| *H10K 77/10* | (2023.01) | |
| *H01L 27/146* | (2006.01) | |
| *G02F 1/1333* | (2006.01) | |
| *H10K 50/828* | (2023.01) | |
| *H10K 102/00* | (2023.01) | |

(52) U.S. Cl.
CPC ......... *H10K 59/131* (2023.02); *H10K 77/111* (2023.02); *G02F 1/133305* (2013.01); *H01L 27/14678* (2013.01); *H01L 33/42* (2013.01); *H01L 33/44* (2013.01); *H10K 50/828* (2023.02); *H10K 2102/00* (2023.02); *H10K 2102/311* (2023.02)

(58) Field of Classification Search
CPC .... H10K 50/844; H10K 50/828; H10K 59/40; H10K 59/124; H10K 59/131; H10K 77/111; H10K 2102/00; H10K 2102/311; H05B 33/04
See application file for complete search history.

(56) References Cited

U.S. PATENT DOCUMENTS

| | | | | |
|---|---|---|---|---|
| 2015/0177879 | A1* | 6/2015 | Misaki | G06F 3/0446 345/174 |
| 2015/0318339 | A1* | 11/2015 | Nakamura | H01L 51/524 257/98 |
| 2016/0118416 | A1* | 4/2016 | Yamazaki | G02F 1/136213 257/43 |
| 2016/0147109 | A1* | 5/2016 | Yamazaki | H01L 51/524 257/40 |
| 2016/0299601 | A1* | 10/2016 | Yamazaki | G06F 3/0412 |
| 2016/0349905 | A1* | 12/2016 | Momma | G06F 3/04164 |
| 2017/0205925 | A1* | 7/2017 | Yamazaki | G02F 1/1368 |
| 2017/0249046 | A1* | 8/2017 | Hirosawa | G06F 3/0446 |
| 2017/0269440 | A1* | 9/2017 | Yoshitomi | G06F 1/3265 |
| 2017/0365813 | A1* | 12/2017 | Kamiya | G06F 3/0446 |
| 2018/0013096 | A1* | 1/2018 | Hamada | H10K 59/40 |
| 2018/0059840 | A1* | 3/2018 | Hirosawa | G06F 3/0446 |
| 2018/0061900 | A1* | 3/2018 | Hiraga | H01L 27/323 |
| 2018/0068919 | A1* | 3/2018 | Chung | H01L 51/5253 |
| 2018/0090544 | A1* | 3/2018 | Gunji | H10K 50/81 |

* cited by examiner ium Tin Oxide) (for example, Japanese Laid-Open Patent Publication No. 2013-214085). The flexible printed board is formed with wirings for transmitting signals.

DISPLAY DEVICE INCLUDING WIRINGS ELECTRICALLY CONNECTING OXIDE CONDUCTIVE LAYER AND SENSOR ELECTRODE

CROSS REFERENCE TO RELATED APPLICATIONS

This application is a continuation of U.S. patent application Ser. No. 16/841,746, filed on Apr. 7, 2020. Further, this application is based upon and claims the benefit of priority from the prior Japanese Patent Application No. 2017-202379 filed on Oct. 19, 2017, and PCT Application No. PCT/JP2018/032548 filed on Sep. 3, 2018, the entire contents of which are incorporated herein by reference.

FIELD

One embodiment of the present invention relates to a display device and methods for manufacturing the display device.

BACKGROUND

In a display device to which a flexible printed board is attached, a connection electrode on a substrate side may be formed by an ITO (Indium Tin Oxide) (for example, Japanese Laid-Open Patent Publication No. 2013-214085). The flexible printed board is formed with wirings for transmitting signals.

SUMMARY

A display device according to an embodiment of the present invention includes a substrate, a display region arranged on the substrate and including a plurality of pixels, a first wiring provided on the substrate, an insulating layer overlapping a portion of the first wiring, an oxide conductive layer provided on the first wiring and electrically connected to the first wiring, a sealing layer overlapping the display region and at least an end of the oxide conductive layer and sealing the plurality of pixels, a sensor electrode provided on the sealing layer and overlapping the display region, and a second wiring passing over the at least end of the oxide conductive layer provided with the sealing layer and electrically connecting the sensor electrode and the oxide conductive layer.

A methods for manufacturing display device according to an embodiment of the present invention includes a forming a first wiring on the substrate, forming an insulating layer overlapping a portion of the first wiring, forming an oxide conductive layer electrically connected to the first wiring on the first wiring, forming a sealing layer for sealing a pixels so as to overlap the display region and at least an end of the oxide conductive layer, forming a sensor electrode overlapping the display region including the plurality of pixels on the sealing layer, and forming a second wiring that passes over the at least end of the oxide conductive layer provided with sealing layer and electrically connects the sensor electrode and the oxide conductive layer.

DESCRIPTION OF EMBODIMENTS

Figure 1:
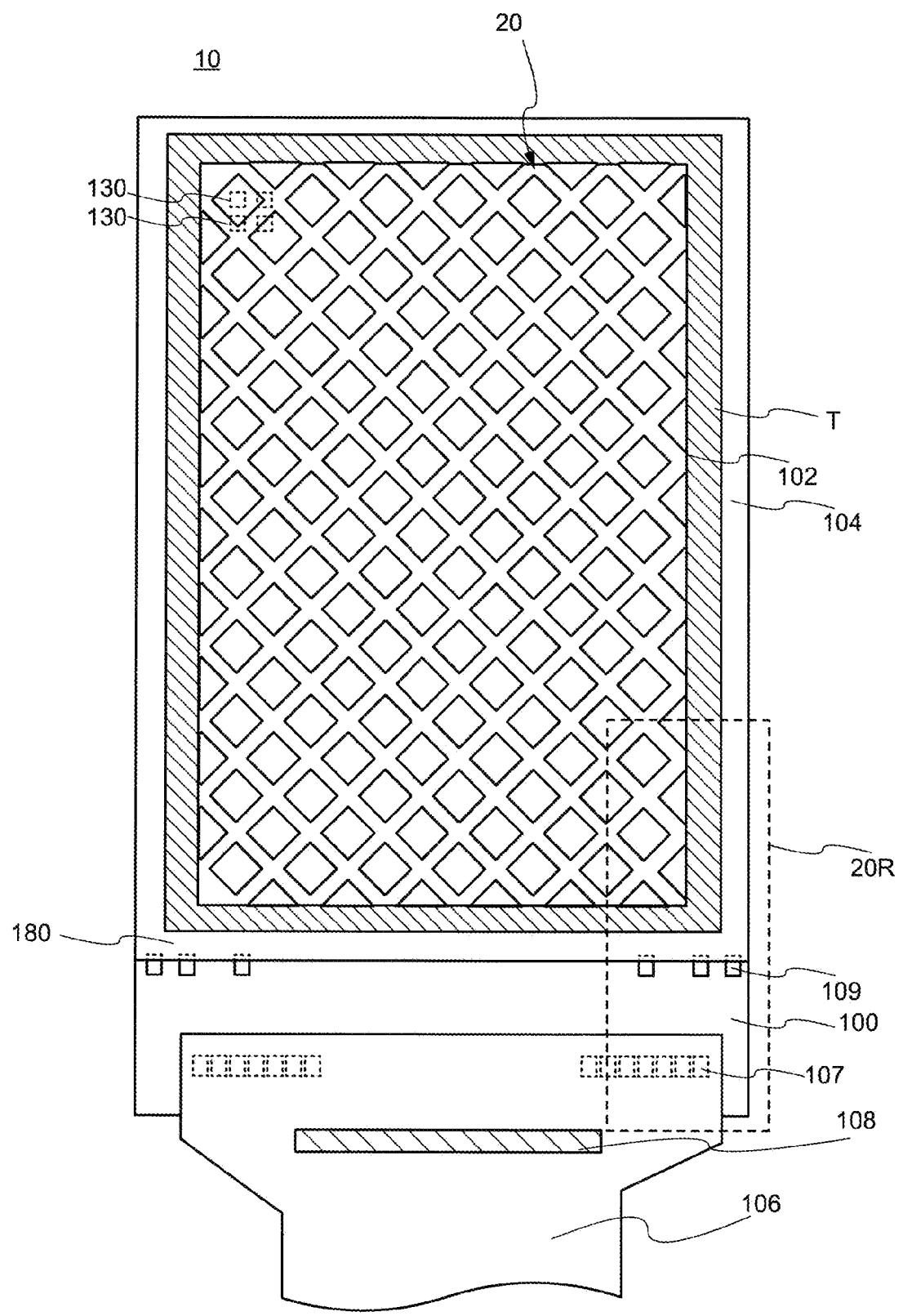
FIG. 1 is a top view showing a configuration of a display device according to the first embodiment of the present invention.

A display device provided with the on-cell type touch sensor for forming a sensor electrode on the sealing layer can be expected to contribute to thinning and low costs of the display device. In such a display device, a wiring extending from the electrodes used for a touch sensor (hereinafter, referred to as "sensor electrode") may be arranged on the substrate and electrically connected to a predetermined terminal. The wiring may be susceptible to fracture due to the topography of the substrate.

In view of the above problems, it is one object of the present invention to provide a technique for electrically connecting the sensor electrode and the terminal while suppressing the terminal on the substrate from being damaged.

Each embodiment of the present invention is explained below while referring to the drawings. It is noted that the disclosure is merely an example, and those skilled in the art can easily conceive of appropriate modifications while maintaining the gist of the invention are naturally included in the scope of the invention. In addition, although the drawings may schematically represent the width, thickness, shape, and the like of each portion as compared with actual embodiments for the sake of clarity of description, the drawings are merely an example and do not limit the interpretation of the present invention.

In this specification and each drawing, the same reference numerals are assigned to the same elements as those described above with reference to the preceding drawings, and detailed description thereof may be omitted as appropriate. In addition, the letters "first" and "second" to each element are convenient labels used to distinguish each element and have no further meaning unless otherwise stated.

Also, in this specification, when one member or region is "above (or below)" another member or region, this includes not only being directly above (or below) the other member or region, but also being above (or below) the other member or region, i.e., including other components in between above (or below) the other member or region. In the following explanation, unless otherwise specified, in the cross-sectional view, the side on which display element is arranged with respect to the substrate is referred to as "upper" or "upper surface", and the opposite side is referred to as "lower" or "lower surface".

Also, the phrases "α includes A, B, or C", "α includes any of A, B, and C", and "α includes one selected from the group consisting of A, B, and C" in this specification do not exclude the case where α includes a plurality of combinations of A to C, unless otherwise specified. Furthermore, these expressions do not exclude the case where α includes other elements.

First Embodiment

<1. Configuration of the Display Device>

FIG. 1 shows a top view of a display device 10 according to an embodiment of the present disclosure.

The display device 10 is an organic EL display device. The display device 10 includes a substrate 100, a flexible printed board 106, a plurality of terminals 107, a driving circuit 108, a plurality of terminals 109, and a touch sensor 20.

A top surface of the substrate 100 includes a display region 102 and a peripheral region 104. The display region 102 is a region for displaying an image (static image or moving image). The display region 102 includes a plurality of pixels 130. The plurality of pixels 130 is arranged in a matrix, for example. The peripheral region 104 is a region the perimeter of the display region 102 and is a non-display region, displaying no images.

The plurality of terminals 107 is provided on the peripheral region 104 above the substrate 100. The flexible printed board 106 is affixed to the substrate 100 at the peripheral region 104 and is electrically connected to each of the plurality of terminals 107. The driving circuit 108 is provided on the flexible printed board 106. The flexible printed board 106 drives the plurality of pixels 130 and the touch sensor 20. Specifically, the driving circuit 108 supplies signals for driving the plurality of pixels 130 (e.g., various video signals and control signals) and signals for driving the touch sensor 20 (e.g., signals for instructing the sensor electrode to supply voltages for detecting). Although not shown in FIG. 1, a gate driver and a source driver may be provided on the substrate 100. The gate driver and the source driver drive the plurality of pixels 130 in response to signals from the driving circuit 108.

The touch sensor 20 is superimposed on the display region 102. The touch sensor 20 is here an on-cell touch sensor. The on-cell method is a method of incorporating the touch sensor inside the display device. The plurality of terminals 109 is provided on the peripheral region 104 on the substrate 100. Each of the plurality of terminals 109 is electrically connected to the flexible printed board 106 via any one of the terminals 107.

<2. Configuration of the Touch Sensor 20>

Figure 2:
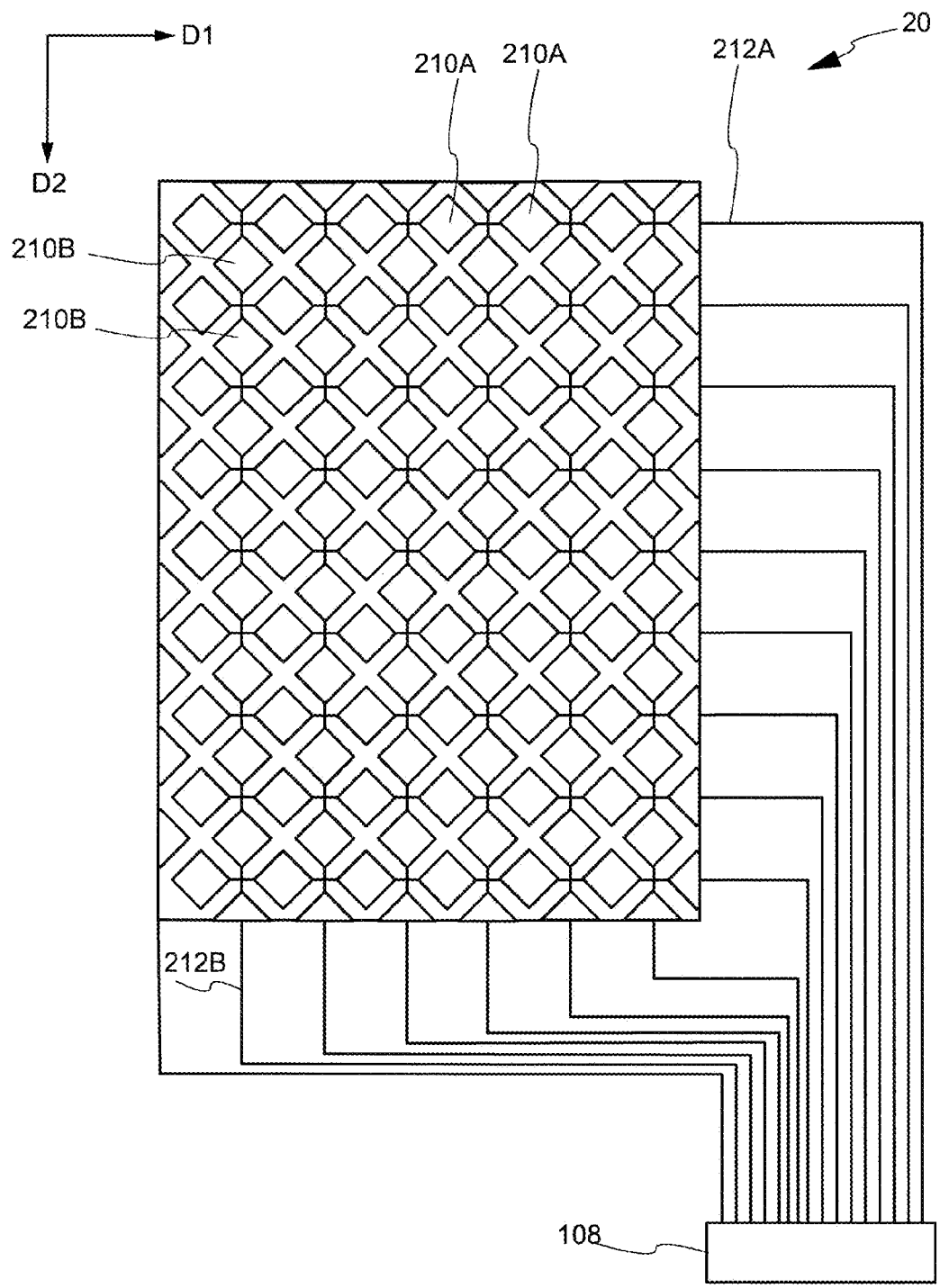
FIG. 2 is a top view showing a touch sensor according to the first embodiment the first embodiment of the present invention.

FIG. 2 is a top view showing the touch sensor 20. Here, the touch sensor 20 is a mutual-capacitive touch sensor. The touch sensor 20 includes a plurality of first sensor electrodes 210A and a plurality of second sensor electrodes 210B. Each of the plurality of first sensor electrodes 210A and the plurality of second sensor electrodes 210B overlaps with the display region 102. The plurality of first sensor electrodes 210A and the plurality of second sensor electrodes 210B are insulated from each other.

Here, the first sensor electrode 210A and the second sensor electrode 210B are diamond-shaped electrodes having diagonals in the D1 and D2 directions. Although, the first sensor electrode 210A and the second sensor electrode 210B are, for example, transparent conductive film using indium zinc oxide (IZO), using as the first sensor electrode 210A and the second sensor electrode 210B may be indium tin oxide (ITO), zinc oxide (ZnO), indium tin oxide zinc (ITZO), or the like.

The plurality of first sensor electrodes 210A and the plurality of second sensor electrodes 210B are arranged, respectively. The two first sensor electrodes 210A adjacent to each other in the short side direction (hereinafter referred to as "D1 direction") of the display region 102 are connected to each other. The two first sensor electrodes 210A adjacent to each other in the long side direction of the display region 102 (hereinafter referred to as "D2 direction") are separated from each other. The wiring including the plurality of first sensor electrodes 210A extending in the D1 direction is hereinafter referred to as "a first touch sensor wiring 212A". The two second sensor electrodes 210B adjacent to each other in the D2 direction are connected to each other. The two second sensor electrodes 210B adjacent to each other in the D1 direction are separated from each other. The wiring including the plurality of second sensor electrodes 210B extending in the D2 direction is hereinafter referred to as "a second touch sensor wiring 212B". The D1 and the D2 directions intersect each other. The first sensor electrode 210A is the transmit electrode in the touch sensor 20. The second sensor electrode 210B is a receiving electrode in the touch sensor 20. Alternatively, the second sensor electrode 210B may be the transmitting electrode in the touch sensor 20, and the first sensor electrode 210A may be the receiving electrode in the touch sensor 20.

Figure 3:
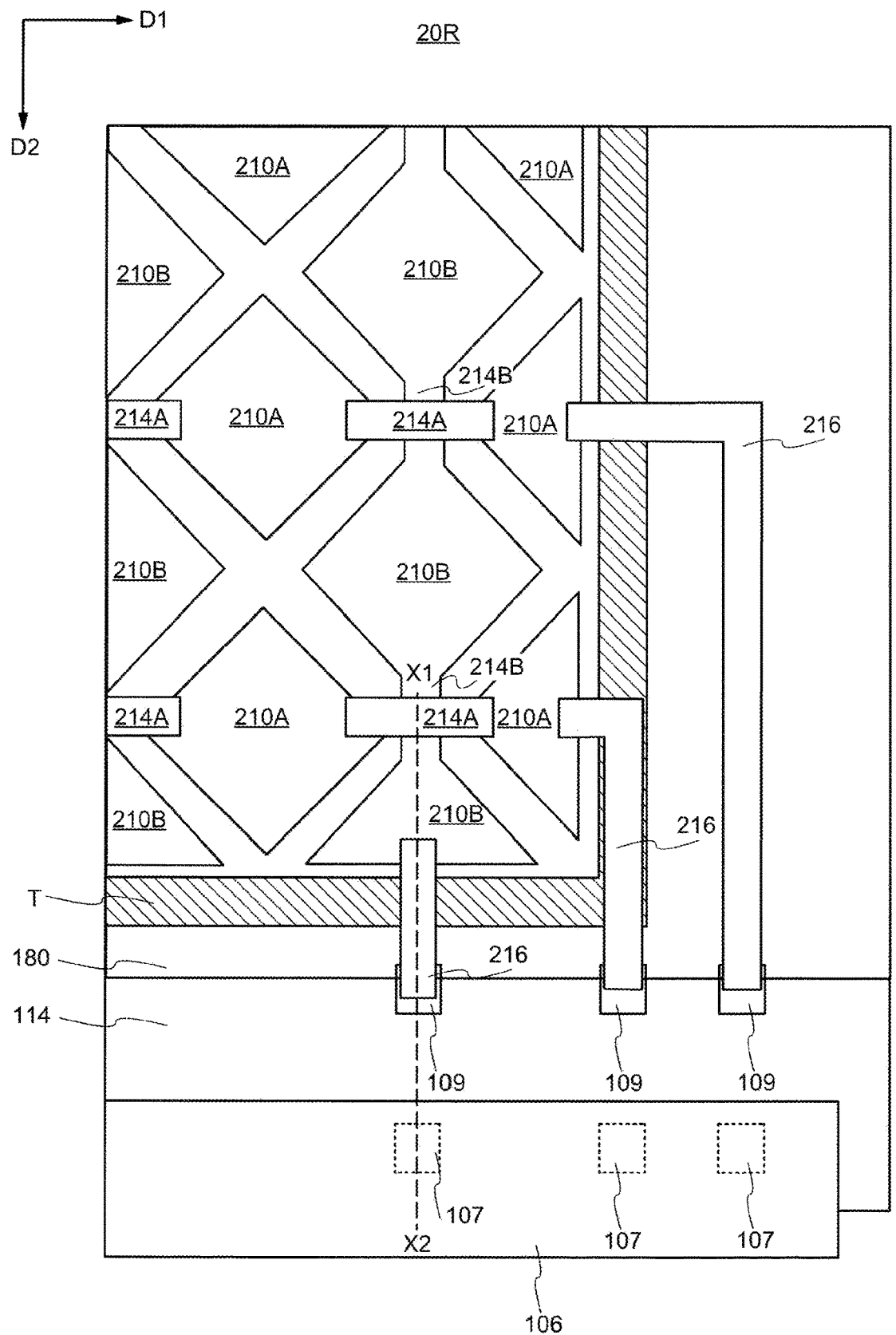
FIG. 3 is a top view showing a portion of a touch sensor according to the first embodiment of the present invention.

FIG. 3 is an enlarged top view of a region 20R which is a portion of the touch sensor 20. The two first sensor electrodes 210A adjacent to each other in the D1 direction are electrically connected to each other through a bridge member 214A. The bridge member 214A may be formed of the same material as the first sensor electrode 210A or may be formed of a different material. The first touch sensor wiring 212A shown in FIG. 2 includes the plurality of first sensor electrodes 210A, a plurality of bridge members 214A, and a lead wiring 216. The two second sensor electrodes 210B adjacent to each other in the D2 direction are electrically connected to each other through a bridge member 214B. The bridge member 214A is provided on the bridge member 214B. The intersection of the bridge member 214A and the bridge member 214B is insulated vertically through the insulating layer. The second touch sensor wiring 212B shown in FIG. 2 includes the plurality of second sensor electrodes 210B, the plurality of bridge members 214B, and the lead wiring 216.

Hereinafter, when the first sensor electrode 210A and the second sensor electrode 210B are not distinguished from each other, they are collectively referred to as "sensor electrode 210". Of the plurality of sensor electrodes 210, the sensor electrode 210 adjoining the respective sides of the display region 102 is electrically connected to any one of the terminal members 109 via the lead wiring 216. The lead wiring 216 is provided on a moisture shut-off region T and a sealing layer 180.

<3. Driving the Touch Sensor 20>

The driving circuit 108 supplies voltages to the first sensor electrode 210A via the plurality of first touch sensor wirings 212A. An electric field corresponding to the supplied voltages is generated between the first sensor electrode 210A and the second sensor electrode 210B. For example, when a human finger touches the display device 10, the electric field between the first sensor electrode 210A and the second sensor electrode 210B changes. As a result, the capacitance between the first touch sensor wiring 212A and the second touch sensor wiring 212B. The driving circuit 108 receives signals from the second sensor electrode 210B via the plurality of second touch sensor wirings 212B. Based on these signals, the display device 10 detects a position touched by a human finger. In this instance, the driving circuit 108 drives the first sensor electrode 210A to read the change in the capacitance via the second sensor electrode 210B. The driving circuit 108 may, conversely, drive the second sensor electrode 210B to read changes in capacitance values via the first sensor electrode 210A.

<4. Cross-Sectional Structure>

Figure 4:
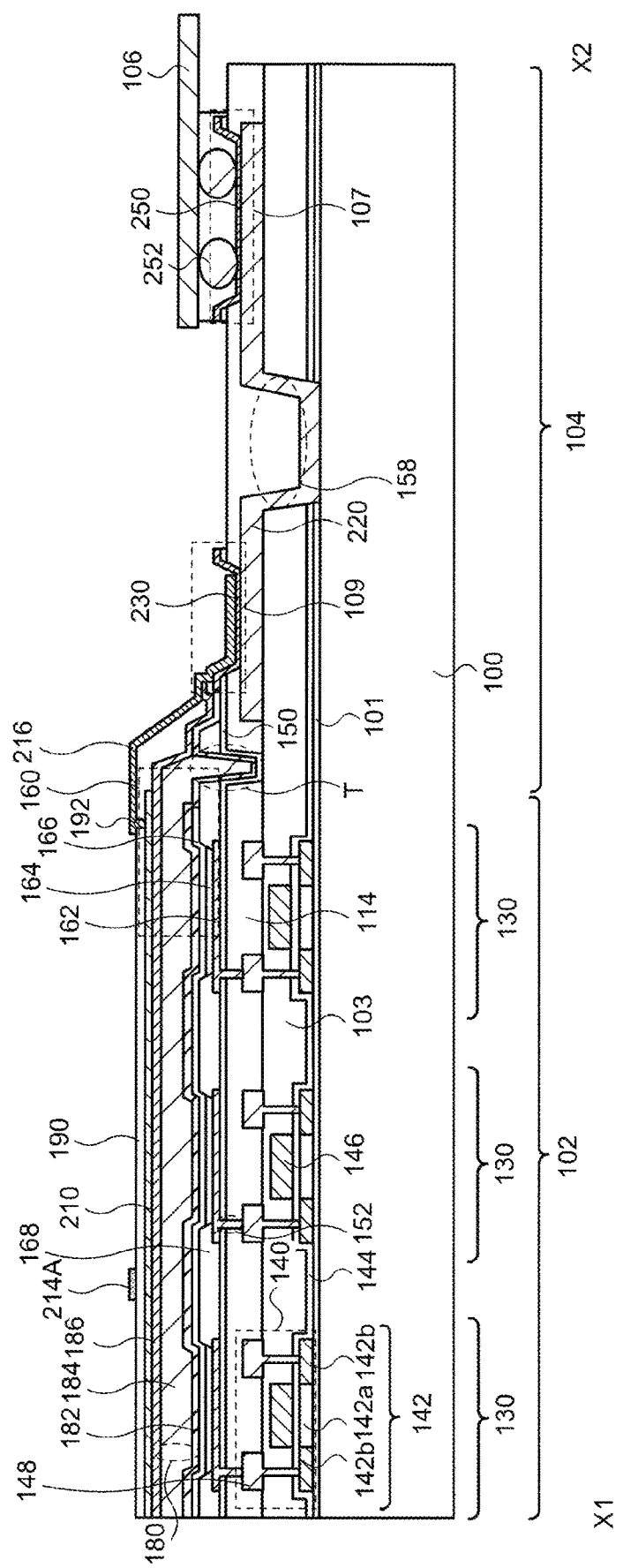
FIG. 4 is a cross-sectional view of the display device according to the first embodiment of the present invention.

FIG. 4 shows a cross-sectional view of the display device 10. FIG. 4 is a cross-sectional view along the cutting line X1-X2 in FIG. 3. The cutting line X1-X2 shows the cutting line passing through the sensor electrode 210, the bridge member 214A, the lead wiring 216, and the terminals 107 and 109.

The substrate 100 is, for example, a substrate having flexibility. The substrate 100 may be referred to as a substrate, a base film, or a sheet-substrate. The substrate 100 is, for example, an organic resin substrate. The organic resinous materials constituting substrate 100 is, for example, polyimides, acrylics, epoxies, and polyethylene terephthalates. The thickness of the substrate 100 is, for example, between 10 μm and several hundred micrometers.

A transistor 140 is provided on the substrate 100 via an under film 101. The transistor 140 includes a semiconductor film 142, a gate insulating film 144, a gate electrode 146, and a source/drain electrode 148. The gate electrode 146 overlaps the semiconductor film 142 via the gate insulating film 144. A channel region 142a of the semiconductor film 142 is a region that overlaps with the gate electrode 146. The semiconductor film 142 has a source/drain region 142b sandwiching the channel region 142a.

An interlayer film 103 is provided on the gate electrode 146. The interlayer film 103 includes, for example, an inorganic insulating film such as a silicon oxide film, a silicon nitride film, or a silicon oxynitride film. The source/drain electrode 148 is connected to the source/drain region 142b at an opening provided in the interlayer film 103 and the gate insulating film 144.

The transistor 140 is here a top-gate type transistor but may be any other transistors. The transistor 140 may be, for example, a bottom gate type transistor, a multi-gate type transistor having a plurality of gate electrodes 146, or a dual-gate type transistor having a configuration in which the upper and lower sides of the semiconductor film 142 are sandwiched by two gate electrodes 146.

A terminal wiring 220 is a first wiring provided on the substrate 100. The terminal wiring 220 is provided on the peripheral region 104. The terminal wiring 220 is in contact with the substrate 100 at a region 158 where the interlayer film 103, the gate insulating film 144, and the under film 101 have been removed. In this section, the display device 10 is foldable. The inorganic insulating film has low toughness and is susceptible to cracking when bending forces are applied. Therefore, it is preferable to remove the portion around the bent portion as shown in FIG. 4. The terminal wiring 220 is formed of, for example, a material containing aluminum, copper, molybdenum, or tungsten as a main component, but may be formed of a material other than aluminum, copper, molybdenum, or tungsten.

A planarization film 114 is provided overlapping a portion of the terminal wiring 220. Specifically, the planarization film 114 overlaps the interlayer film 103 and the transistor 140 in addition to a portion of the terminal wiring 220. The upper surface of the planarization film 114 is flat. The planarization film 114 includes, for example, an acrylic resin, an organic resin including polysiloxane, polyimides, polyesters, and the like. The planarization film 114 is an insulating layer (the first insulating layer) containing an organic substance. An inorganic insulating film 150 is provided on the planarization film 114. The inorganic insulating film 150 protects a semiconductor device such as the transistor 140. The planarization film 114 and the inorganic insulating film 150 are provided with a contact hole 152. The contact hole 152 is an opening for electrically connecting a first electrode 162 and the source/drain electrode 148 of a light-emitting element 160, which will be described later.

The light-emitting element 160 is provided on the inorganic insulating film 150. The light-emitting element 160 includes the first electrode (the pixel electrode) 162, an emitting layer 164, and a second electrode (the counter electrode) 166. The first electrode 162 covers the contact hole 152. The first electrode 162 is electrically connected to the source/drain electrode 148. A bank 168 covers the end of the first electrode 162. The bank 168 covers the end of the first electrode 162. This prevents disconnection of the emitting layer 164 and the second electrode 166 provided thereon. The pixel 130 includes the light-emitting element 160 and the transistor 140.

The emitting layer 164 covers the first electrode 162 exposed from the bank 168. Although, in FIG. 4, the emitting layer 164 is formed only on an opening of the bank 168, a portion of the emitting layer 164 may be formed to extend over the bank 168 or may be uniformly formed as a plurality of pixel layers. The second electrode 166 is provided on the emitting layer 164. Here, the emitting layer 164 is formed of using low molecular weight or high molecular weight organic EL materials. The emitting layer 164 emits light in response to voltages supplied to the first electrode 162 and the second electrode 166. Specifically, carriers are injected from the first electrode 162 and the second electrode 166 into the emitting layer 164. Within the emitting layer 164, the carriers recombine. The emitting layer 164 emits light when the luminescent molecules go into an excited state and the excited state relaxes to a ground state. A region in contact with the first electrode 162 and the emitting layer 164 is the light emission region of the pixel 130. The emitting layer 164 includes, for example, a carrier injection layer, a carrier transport layer, an emitting layer, a carrier blocking layer, and an exciton blocking layer. The light-emitting element 160 is an organic EL element.

An oxide conductive layer 230 is provided on the terminal wiring 220. Specifically, the oxide conductive layer 230 is provided directly above the terminal wiring 220 in a contact hole provided in the planarization film 114 and the inorganic insulating film 150. The terminal 109 is an electrode in which the terminal wiring 220 is brought into stacked layer with the oxide conductive layer 230 in the contact hole. The oxide conductive layer 230 is formed of, for example, indium tin oxide (ITO), but may also be formed of a conductive oxide such as indium zinc oxide (IZO), zinc oxide (ZnO), or indium tin oxide zinc (ITZO).

The sealing layer 180 is provided on the display region 102 and a portion of the peripheral region 104 to seal the plurality of pixels 130. The sealing layer 180 is provided at least at the end of a portion of the oxide conductive layer 230 in the terminal member 109 of the peripheral region 104. The sealing layer 180 prevents impurities (moisture, and oxygen, etc.) from entering the light-emitting element 160 and the transistor 140 from the outside. The sealing layer 180 specifically includes a first inorganic film 182, an organic film 184, and a second inorganic film 186. The first inorganic film 182 and the second inorganic film 186 are, for example, films containing inorganic compound. The first inorganic film 182 and the second inorganic film 186 include, for example, an inorganic insulating material such as a silicon nitride film or an aluminum oxide film. The organic film 184 is provided between the first inorganic film 182 and the second inorganic film 186, and is a film containing organic compound, for example. The organic film 184 includes, for example, organic resins including acrylics, polysiloxane, polyimides, polyesters, and the like.

The sensor electrode 210 (the first sensor electrode 210A and the second sensor electrode 210B) is provided on the sealing layer 180 (more specifically, on the second inorganic film 186) in the display region 102.

An interlayer insulating film 190 is a second insulating layer provided on the sensor electrode 210 and the sealing layer 180. The interlayer insulating film 190 includes, for example, organic resins including acrylics, polysiloxane, polyimides, polyesters, and the like.

The bridge member 214A and the lead wiring 216 are provided on the interlayer insulating film 190. The bridge member 214A is provided at a position that does not overlap the light-emitting element 160, more specifically, at a position that overlaps the bank 168. The interlayer insulating film 190 is provided with a contact hole 192. The contact hole 192 is an opening for electrically connecting the sensor electrode 210 and the lead wiring 216.

Below the lead wiring 216, the planarization film 114 is provided with a contact hole. As a result, the inorganic insulating film 150, the first inorganic film 182, and the organic film 184 are turned stacked layer. This stacked structure configures the moisture shut-off region T, since it prevents the penetration of moisture into the emitting layer 164.

The lead wiring 216 is provided on the interlayer insulating film 190 and extends from the display region 102 towards the terminal 109. Specifically, the lead wiring 216 is a second wiring that passes over the end of the oxide conductive layer 230 provided with the sealing layer 180 to electrically connect the sensor electrode 210 and the oxide conductive layer 230. The lead wiring 216 is electrically connected to the terminal wiring 220 via the oxide conductive layer 230 without contacting the terminal wiring 220. The lead wiring 216 may be formed of the same material as the terminal wiring 220 or may be formed of a different material.

The terminal 107 is provided on a region of the region on the planarization film 114 closer to the flexible printed board 106 than the region 158. The terminal 107 is an electrode in which an oxide conductive layer 250 (second oxide conductive layer) is stacked layer to the terminal wiring 220 in a contact hole provided in the planarization film 114 and the inorganic insulating film 150. The flexible printed board 106 is not in direct contact with the terminal wiring 220. The oxide conductive layer 250 is electrically connected to the flexible printed board 106 by, for example, an anisotropic conductivity member 252. The signals from the flexible printed board 106 are provided to the lead wiring 216 via the oxide conductive layer 250, the terminal wiring 220, and the oxide conductive layer 230.

Figure 5:
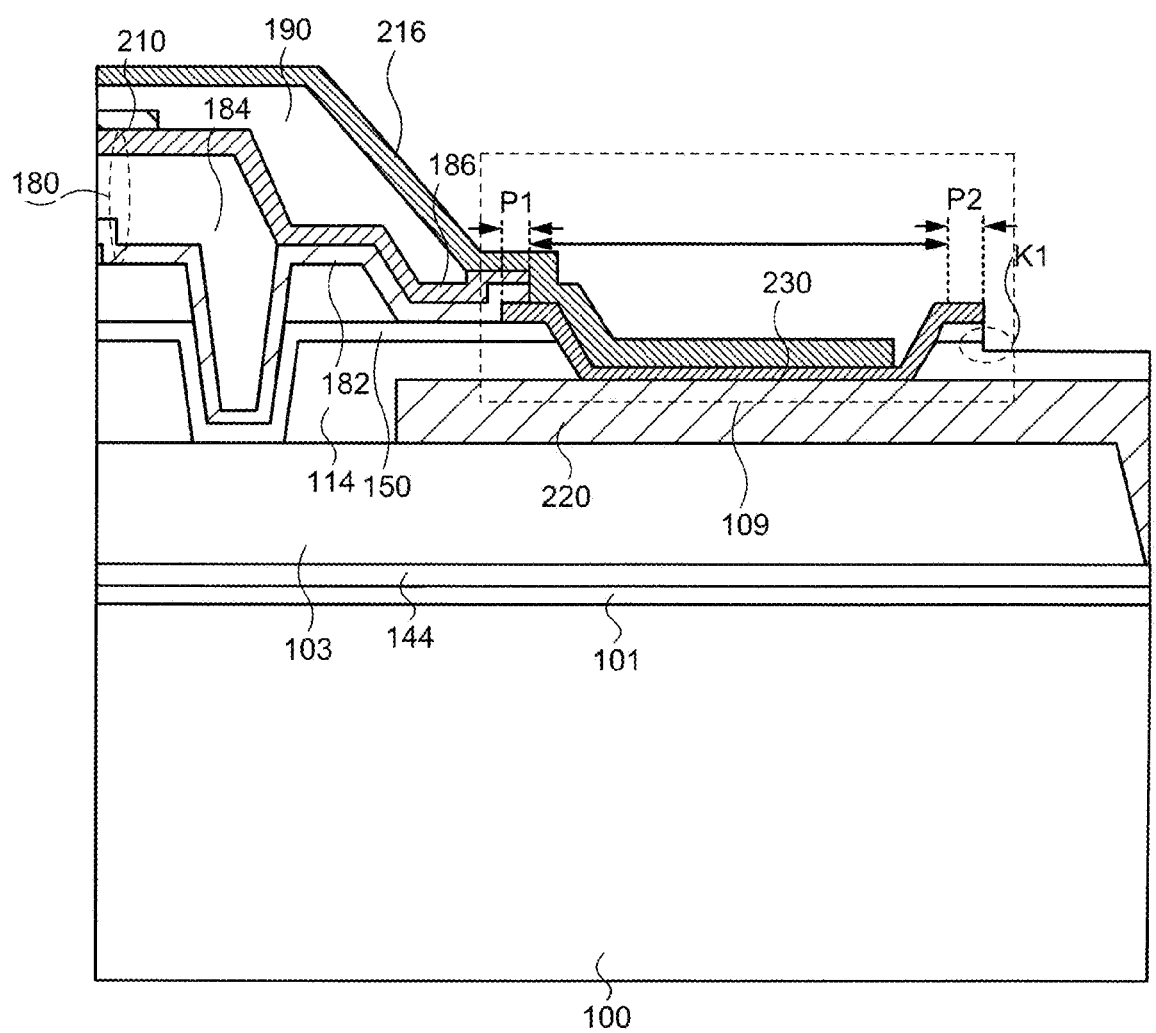
FIG. 5 is a cross-sectional view of the periphery of a region provided with a terminal wiring of the display device according to the first embodiment of the present invention.

FIG. 5 is an enlarged cross-sectional view of the vicinity of the terminal 109. As shown in FIG. 5, the, first inorganic film 182 of the sealing layer 180 is provided on a portion of an end portion P1 of the oxide conductive layer 230 facing the display region 102. On the other hand, the sealing layer 180 is not provided on an end portion P2 of the oxide conductive layer 230, which is opposed to the end portion P1. When the display device 10 is cut by other cutting lines passing through the sensor electrode 210, the bridge member 214A, the lead wiring 216, and the terminal 107 and 109, the cross-sectional structure is substantially the same as the structure described with reference to FIGS. 4 and 5.

In the display device 10, the sealing layer 180 is formed to have a thickness of several micrometers to several tens of micrometers in order to protect the light-emitting element 160 from moisture and the like. Therefore, when the terminal wiring 220 is exposed by etching (e.g., dry etching), the etching needs to be performed sufficiently to avoid the opening shortage due to etching shortage. Therefore, some regions may be over-etched. The over-etching can damage the exposed terminal wiring 220, resulting in yield and reliability degradation problems. Therefore, by providing the terminal wiring 220 with the oxide conductive layer 230, 250 having high etching resistance, the surface of the terminal wiring 220 is less likely to be damaged when over-etching is performed. The oxide conductive layer is generally suitable for reducing damages to the terminal wiring 220 because of its low selectivity to organic layer and wiring etches. In the present embodiment, the terminal 107 includes the oxide conductive layer 250 but may not include the oxide conductive layer 250.

As shown in FIG. 5, the end portion P1 is covered with the first inorganic film 182 of the sealing layer 180. On the other hand, the end portion P2 of the oxide conductive layer 230, which is opposed to the end portion P1, is not covered by the sealing layer 180. At the end portion P2, a part of the planarization film 114 is removed by the above-described over etching, and a step K1 exists on the upper surface of the planarization film 114. On the other hand, in the end portion P1, since the planarization film 114 is not removed due to the presence of the sealing layer 180, such a step does not occur.

Figure 6:
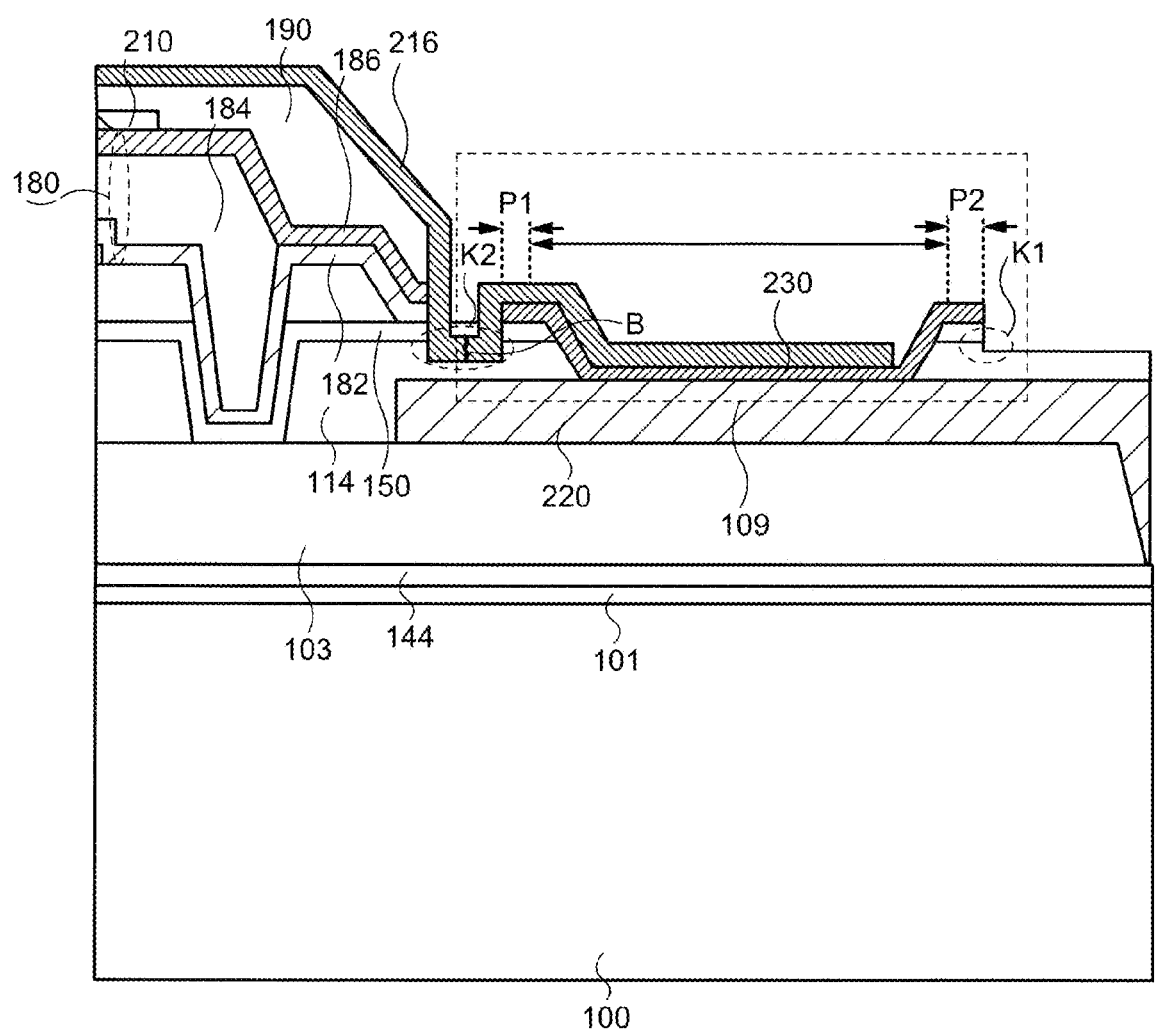
FIG. 6 is a cross-sectional view showing comparative examples according to the first embodiment of the present invention.

As shown in FIG. 6, if the end portion P1 is not covered by the sealing layer 180, a part of the planarization film 114 is removed by the above-described over etching, and a step K2 exists on the upper surface of the planarization film 114. As a result, the lead wiring 216 is a convex downward in the step K2. As a result, the lead wiring 216 nay break, as indicated by a break position B. On the other hand, in the display device 10 of the present embodiment, since the step K2 does not exist, the possibility that the lead wiring 216 is broken is reduced.

In the present embodiment, the first sensor electrode 210A and the second sensor electrode 210B are provided on the upper surface of the interlayer insulating film 190 which is the same insulating surface. Therefore, the reflectance differences between the first sensor electrode 210A and the second sensor electrode 210B are hard to be visually recognized.

Second Embodiment

Figure 7:
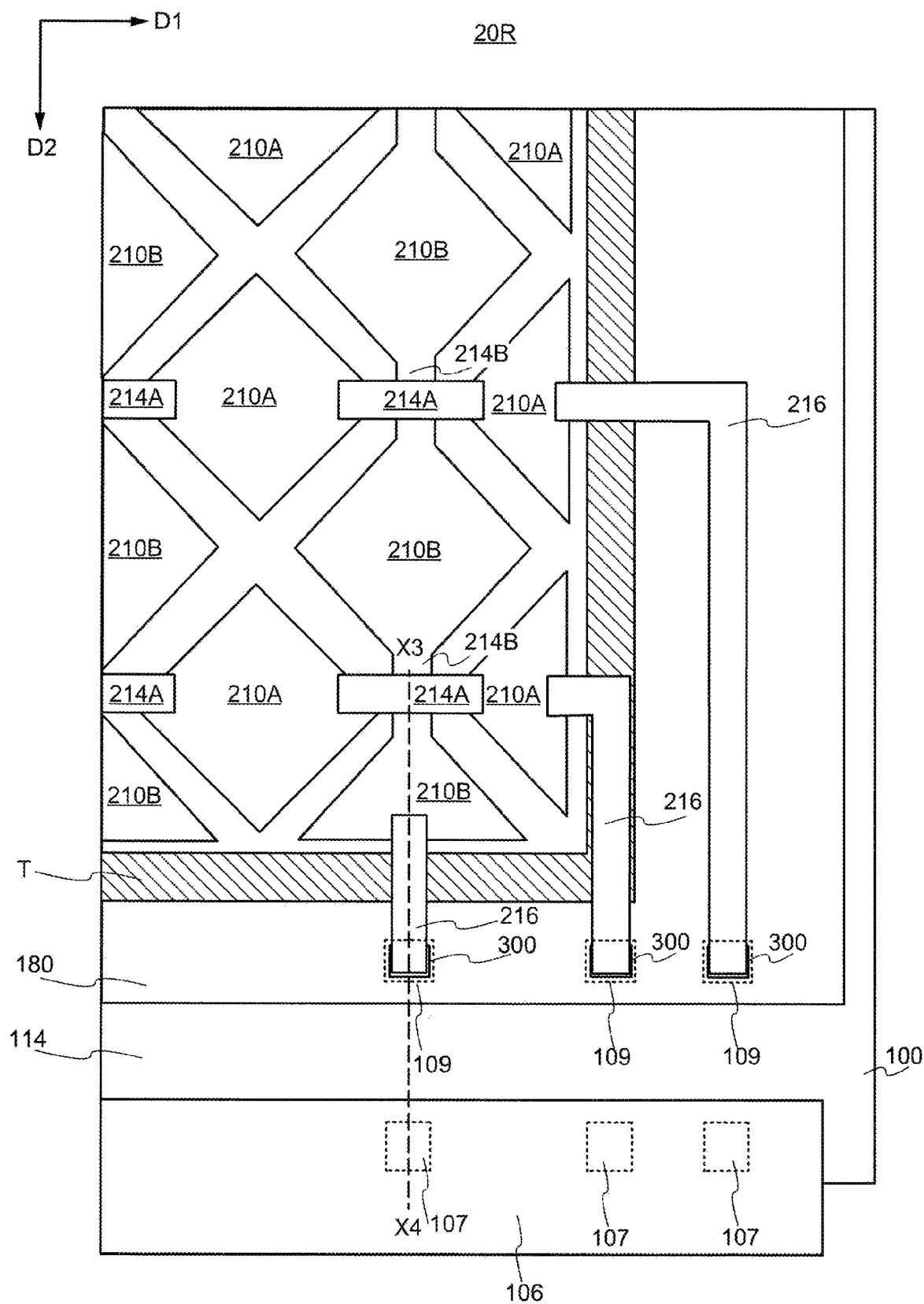
FIG. 7 is a top view showing the configuration of the display device according to the second embodiment of the present invention.
Figure 8:
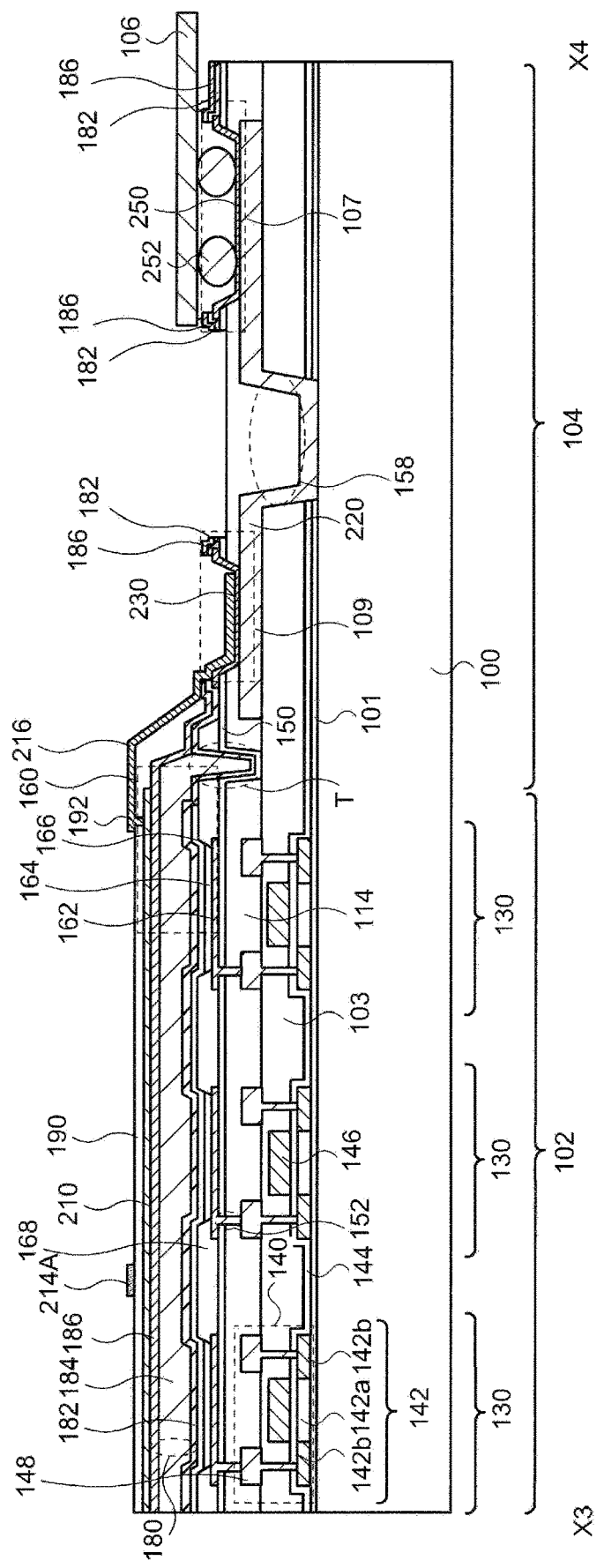
FIG. 8 is a cross-sectional view of the display device according to the second embodiment of the present invention.
Figure 9:
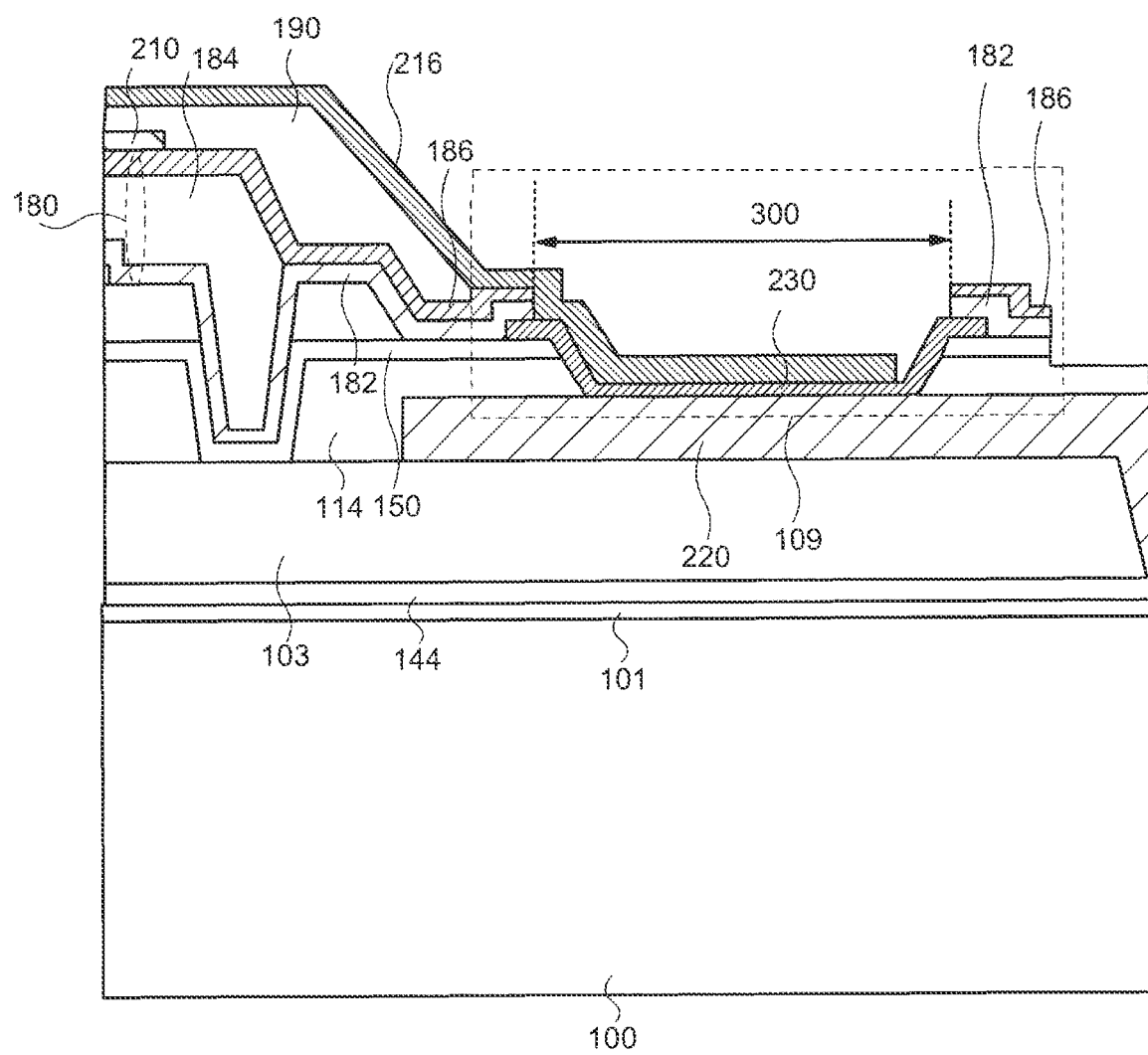
FIG. 9 is a cross-sectional view of the periphery of a region provided with the terminal wiring of the display device according to the second embodiment of the present invention.

FIG. 7 is an enlarged top view of the region 20R which is a part of the touch sensor 20 of the display device 10 according to the second embodiment. FIG. 8 is a cross-sectional view along the cutting line X3-X4 in FIG. 7. The cutting line X3-X4 shows a cutting line passing through the sensor electrode 210, the bridge member 214A, the lead wiring 216, and the terminal 107, 109. FIG. 9 is an enlarged cross-sectional view of the vicinity of the terminal 109. In this embodiment, the sealing layer 180 has an opening 300 corresponding to each of the plurality of terminals 109. The opening 300 is formed such that a sealing layer 180 is provided on all ends of the terminal 109. As shown in FIG. 8, the sealing layer 180 is provided on at least a part of an end portion of the oxide conductive layer 250. The flexible printed board 106 is provided on an end portion of the oxide conductive layer 250 provided with the sealing layer 180 and is electrically connected to the oxide conductive layer 250. As a result, the terminal 107 can be expected to suppress damages to the terminal wiring 220.

Third Embodiment

Figure 10:
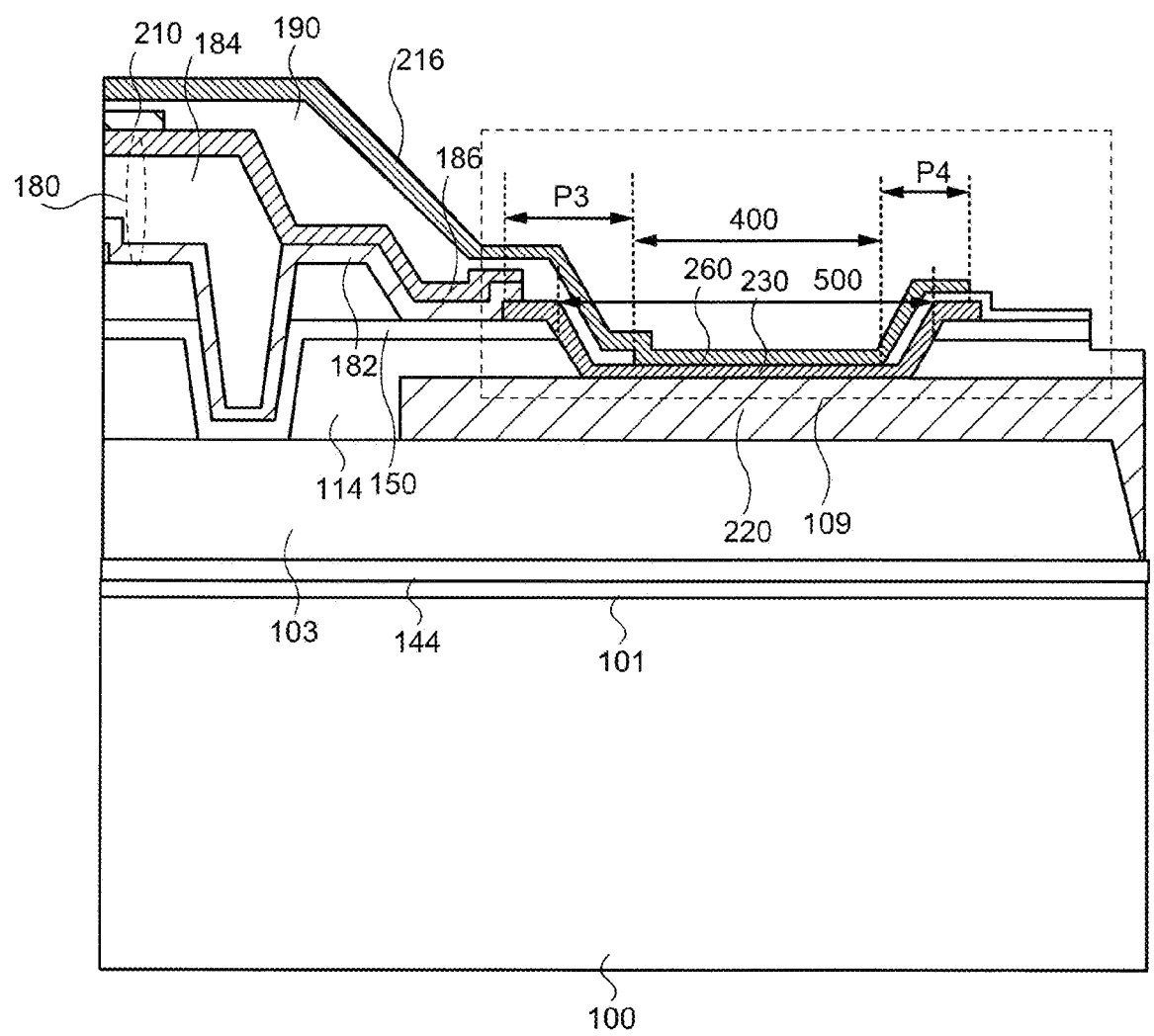
FIG. 10 is a cross-sectional view of the periphery of a region provided with the terminal wiring of the display device according to the third embodiment of the present invention.

FIG. 10 is an enlarged cross-sectional view of the vicinity of the terminal 109 according to the third embodiment. In the third embodiment, the interlayer insulating film 190 is provided in region P3, P4 that overlaps the oxide conductive layer 230. The lead wiring 216 is provided on the interlayer insulating film 190 so that the interlayer insulating film 190 is present directly below it. Therefore, the base film of the part where the lead wiring 216 is formed is made uniform, and the adhesion between the lead wiring 216 and the base film is easily made uniform. As a result, the variation of the CD (Critical Dimension) in the wiring forming is reduced. An opening 400 of the interlayer insulating film 190 exposing the oxide conductive layer 230 is smaller than an opening 500 of the sealing layer 180. This allows the peripheral region 104 to be reduced in size.

Fourth Embodiment

Figure 11:
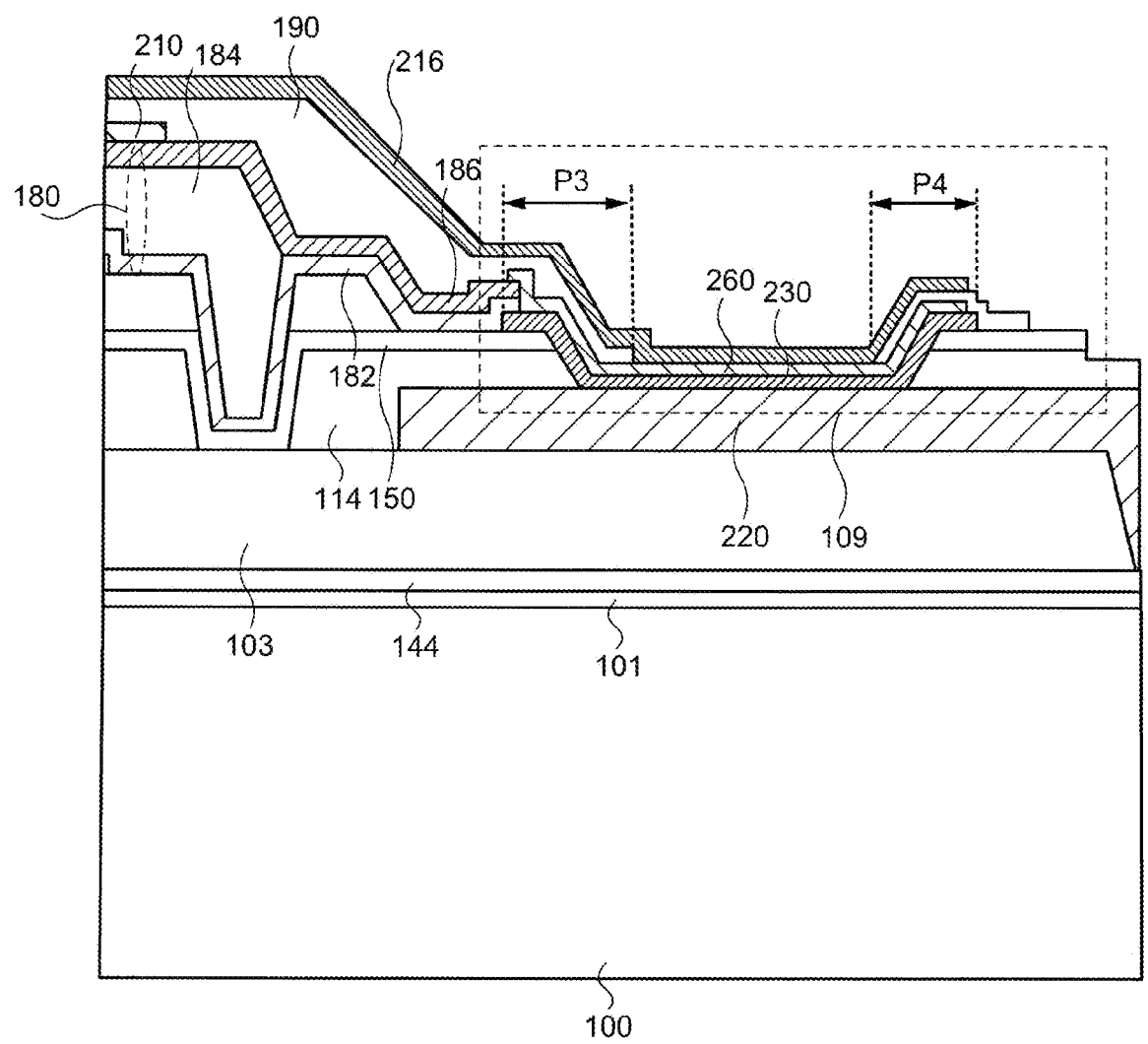
FIG. 11 is a cross-sectional view of the periphery of a region provided with the terminal wiring of the display device according to the fourth embodiment of the present invention.

FIG. 11 is an enlarged cross-sectional view of the vicinity of the terminal 109 according to the fourth embodiment. In this embodiment, a wiring layer 260 (third wiring) is provided between the oxide conductive layer 230 and the lead wiring 216. The wiring layer 260 is provided on the terminal wiring 220, the first inorganic film 182, and the second inorganic film 186. The wiring layer 260 may be formed of the same material as the sensor electrode 210 or may be formed of another material. The lead wiring 216 is electrically connected to the terminal wiring 220 via the wiring layer 260 and the oxide conductive layer 230. The presence of the wiring layer 260 makes the terminal wiring 220 less likely to be damaged.

<5. Manufacturing Method of the Display Device 10>

Examples of methods for manufacturing the display device 10 will be described. FIGS. 12 to 18 are diagrams for explaining the manufacturing process of the display device 10 according to the first embodiment.

Figure 12:
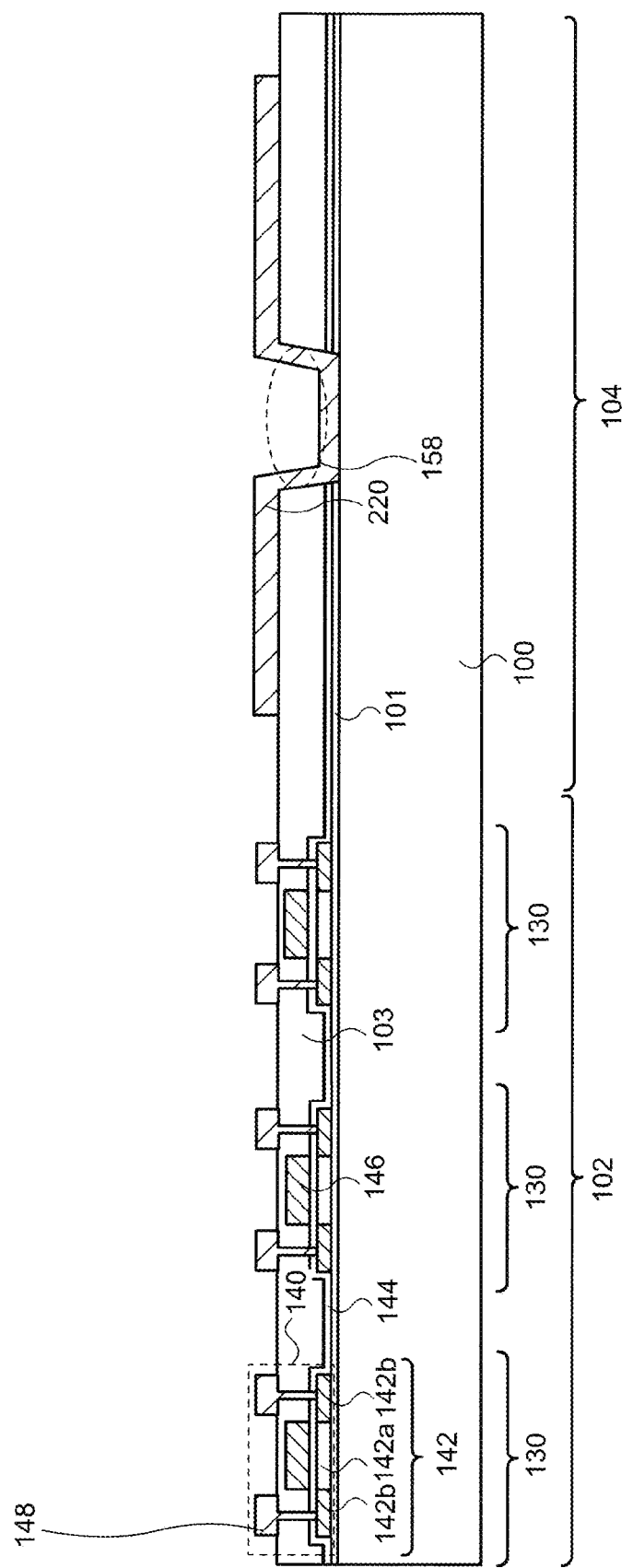
FIG. 12 is a cross-sectional view showing the first step of a process for manufacturing the display device according to an embodiment of the present invention.

FIG. 12 is a diagram for explaining the first step of the manufacturing process of the display device 10. The first step is to form the terminal wiring 220 on the substrate 100. In the present embodiment, the first step is to form the substrate 100 with the under film 101, a semiconductor film 132, the gate insulating film 144, the gate electrode 146, and the interlayer film 103 formed on the substrate 100, and further form the region 158 on the interlayer film 103, and then form a substrate 220 so as to be positioned on the region 158. Various wirings and electrodes are formed by, for example, a sputtering method, an evaporation method, a printing method, an ink-jet method, or the like.

Figure 13:
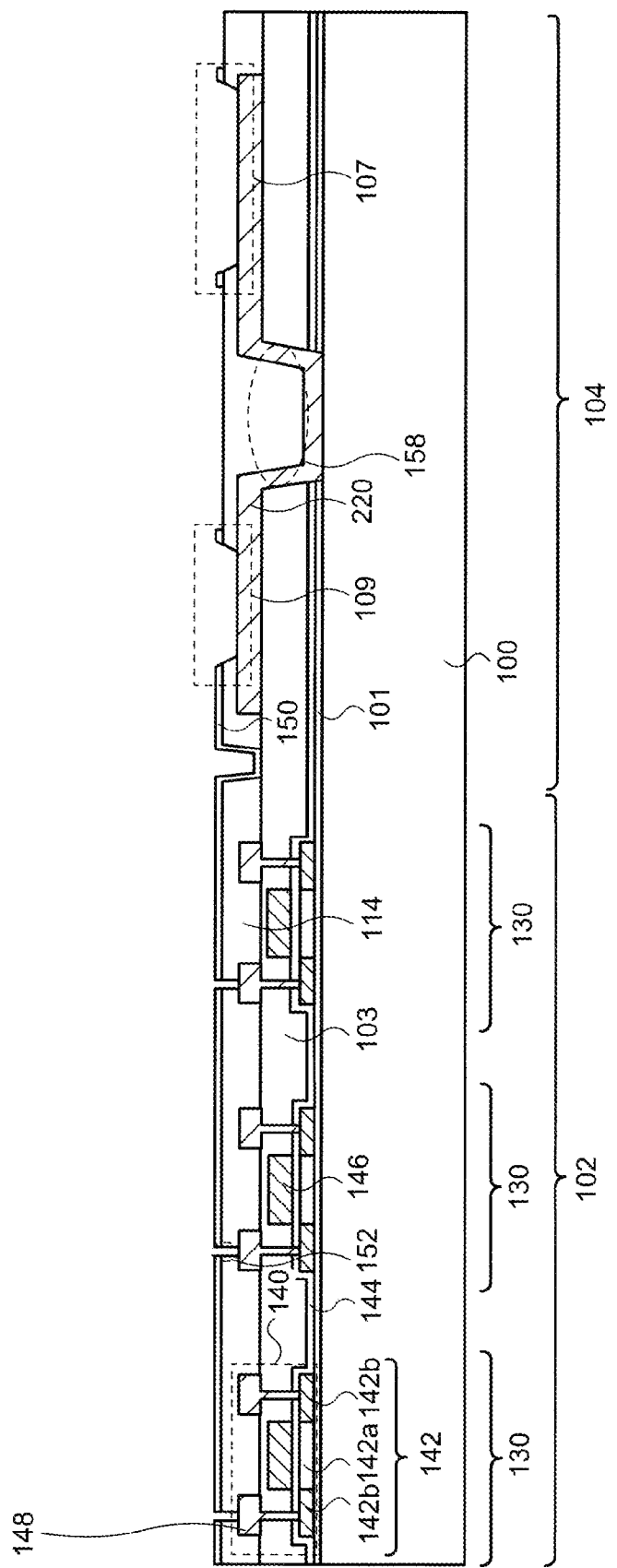
FIG. 13 is a cross-sectional view showing the second step of a process for manufacturing the display device according to an embodiment of the present invention.

FIG. 13 is a diagram for explaining the second step of the manufacturing process of the display device 10. The second step is to form the planarization film 114 on the substrate 100, overlaying a portion of the terminal wiring 220. In this embodiment, the second step is to form the planarization film 114 after the source/drain electrode 148 is formed. The planarization film 114 is provided with a contact hole for forming the contact hole 152 and the oxide conductive layer 230, 250. In the second step, for example, a wet film forming method such as solution coating including a resin material, or formation by photosensitization is used.

Figure 14:
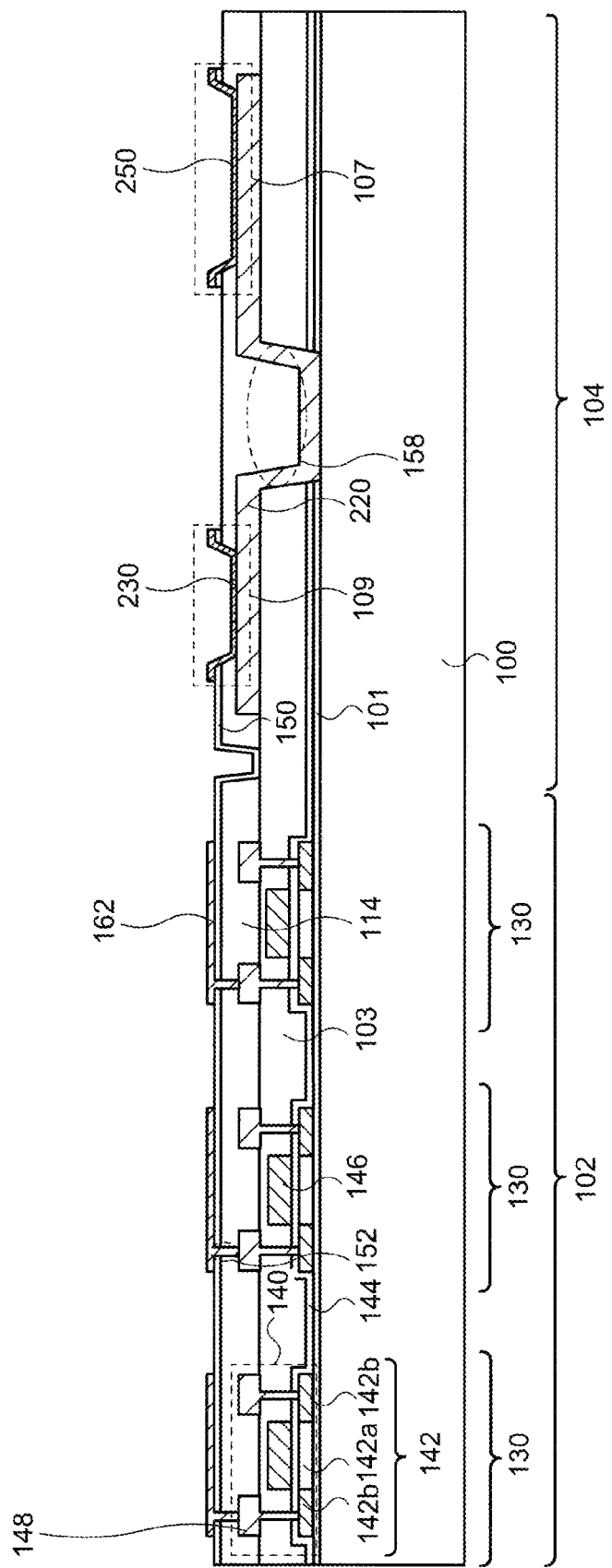
FIG. 14 is a cross-sectional view showing the third step of a process for manufacturing the display device according to an embodiment of the present invention.

FIG. 14 is a diagram for explaining the third step of the manufacturing process of the display device 10. The third step is to form the oxide conductive layer 230, 250 on the planarization film 114 and the terminal wiring 220, which is electrically connected to the terminal wiring 220. In this embodiment, the third step is to form the oxide conductive layer 230, 250 in a predetermined contact hole after the inorganic insulating film 150 is formed on the planarization film 114. The inorganic insulating film 150 is open with a contact hole for forming the contact hole 152, the moisture shut-off region T, and the oxide conductive layer 230, 250.

Figure 15:
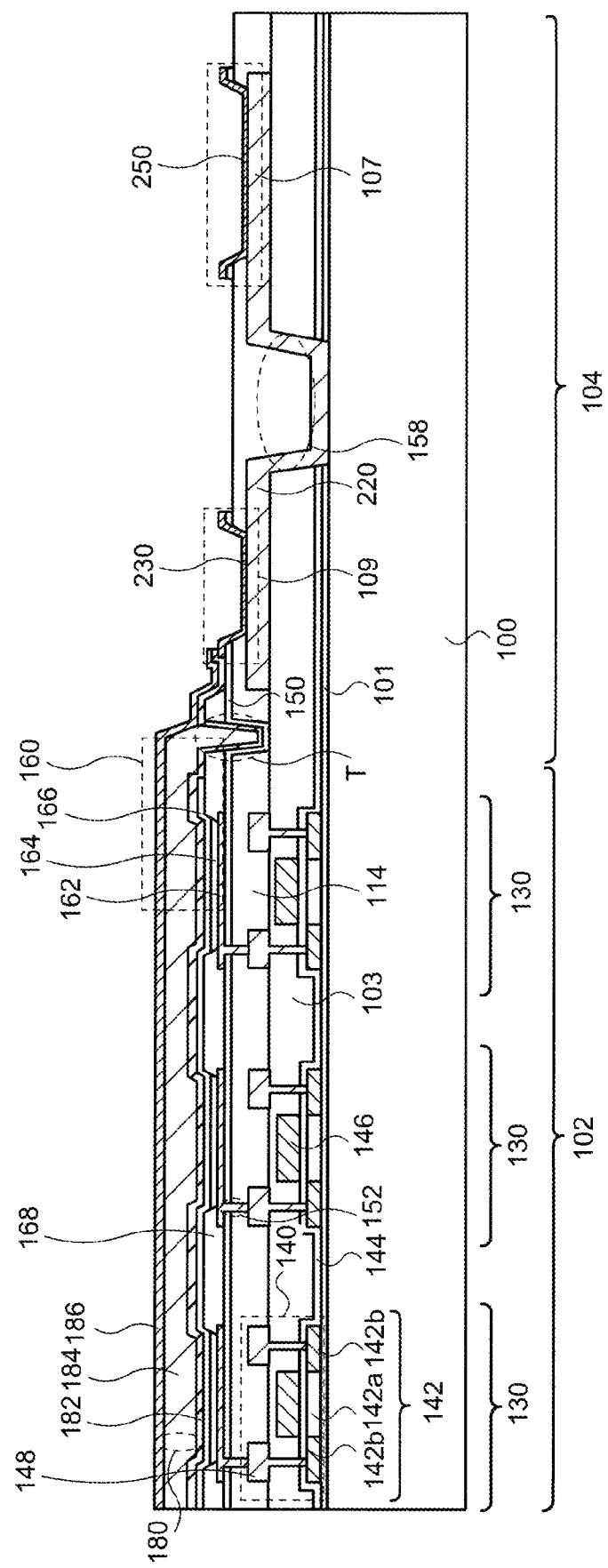
FIG. 15 is a cross-sectional view showing the fourth step of a process for manufacturing the display device according to an embodiment of the present invention.

FIG. 15 is a diagram for explaining the fourth step of the manufacturing process of the display device 10. The fourth step is to form the sealing layer 180 that overlaps the ends of the display region 102 at least a portion of the oxide conductive layer 230, 250, and seals the plurality of pixels 130. In this embodiment, the third step is to form the sealing layer 180 after the plurality of pixels 130, each including the light-emitting element 160, is formed on the inorganic insulating film 150. In the fifth step, for example, a sputtering method, a CVD method, or the like is used.

Figure 16:
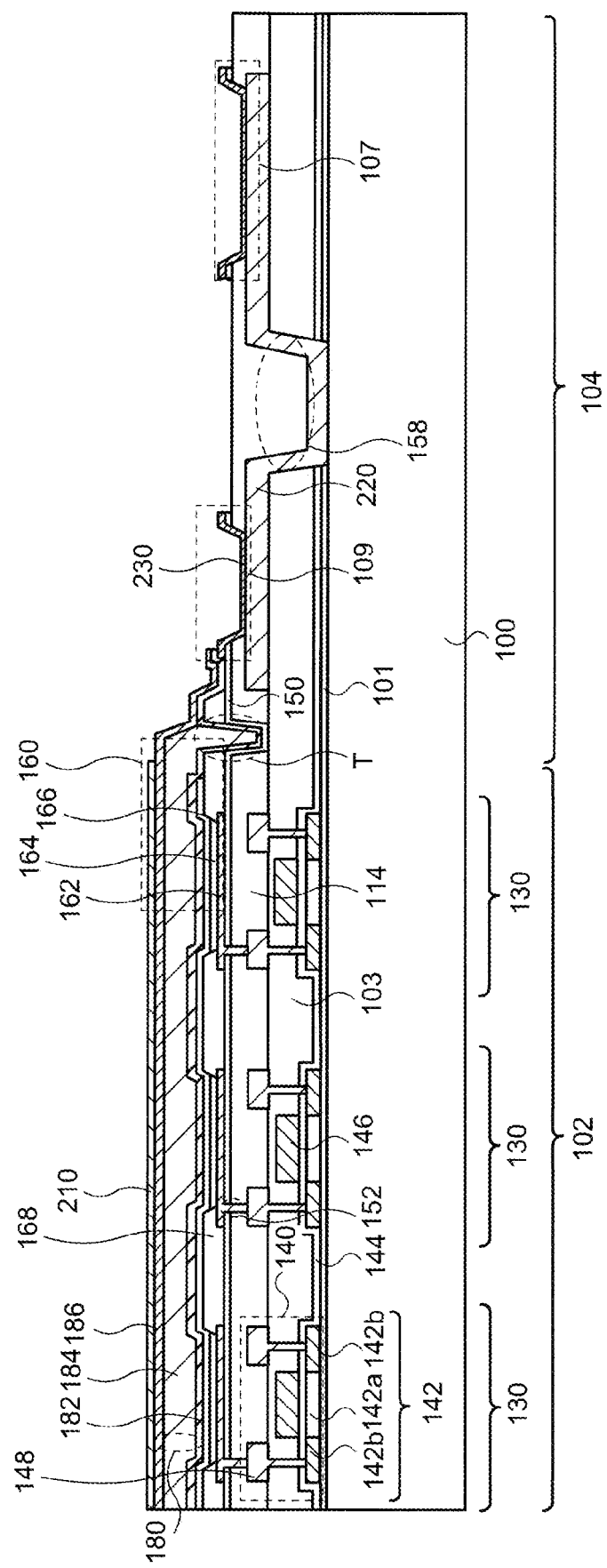
FIG. 16 is a cross-sectional view showing the fifth step of a process for manufacturing the display device according to an embodiment of the present invention.

FIG. 16 is a diagram for explaining the fifth step of the manufacturing process of the display device 10. The fifth step is to form, in the display region 102, the sensor electrode 210 overlying the display region 102 on the sealing layer 180.

Figure 17:
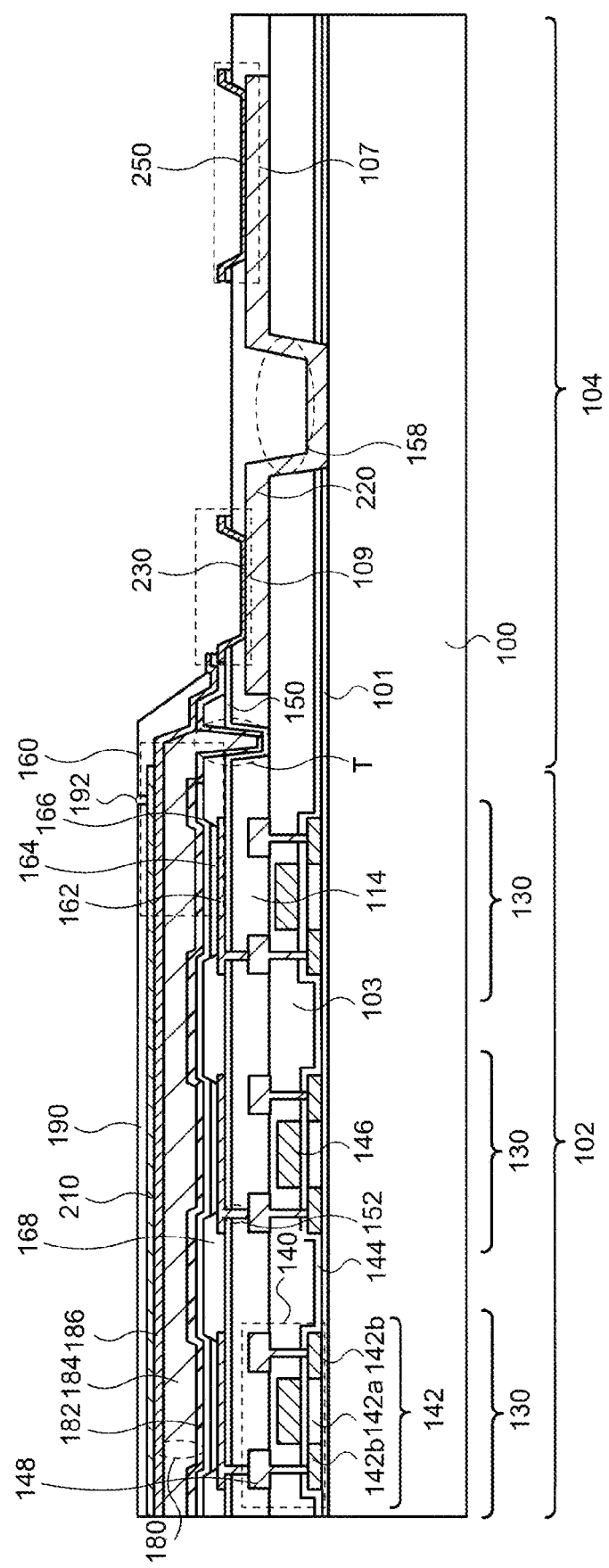
FIG. 17 is a cross-sectional view showing the sixth step of a process for manufacturing the display device according to an embodiment of the present invention.

FIG. 17 is a diagram for explaining the sixth step of the manufacturing process of the display device 10. The sixth step is to form the interlayer insulating film 190 on the sensor electrode 210. The interlayer insulating film 190 is formed of an inorganic insulating film such as a silicon oxide film, a silicon nitride film, or a silicon oxynitride film. In the sixth step, for example, a sputtering method, a CVD method, or the like is used.

Figure 18:
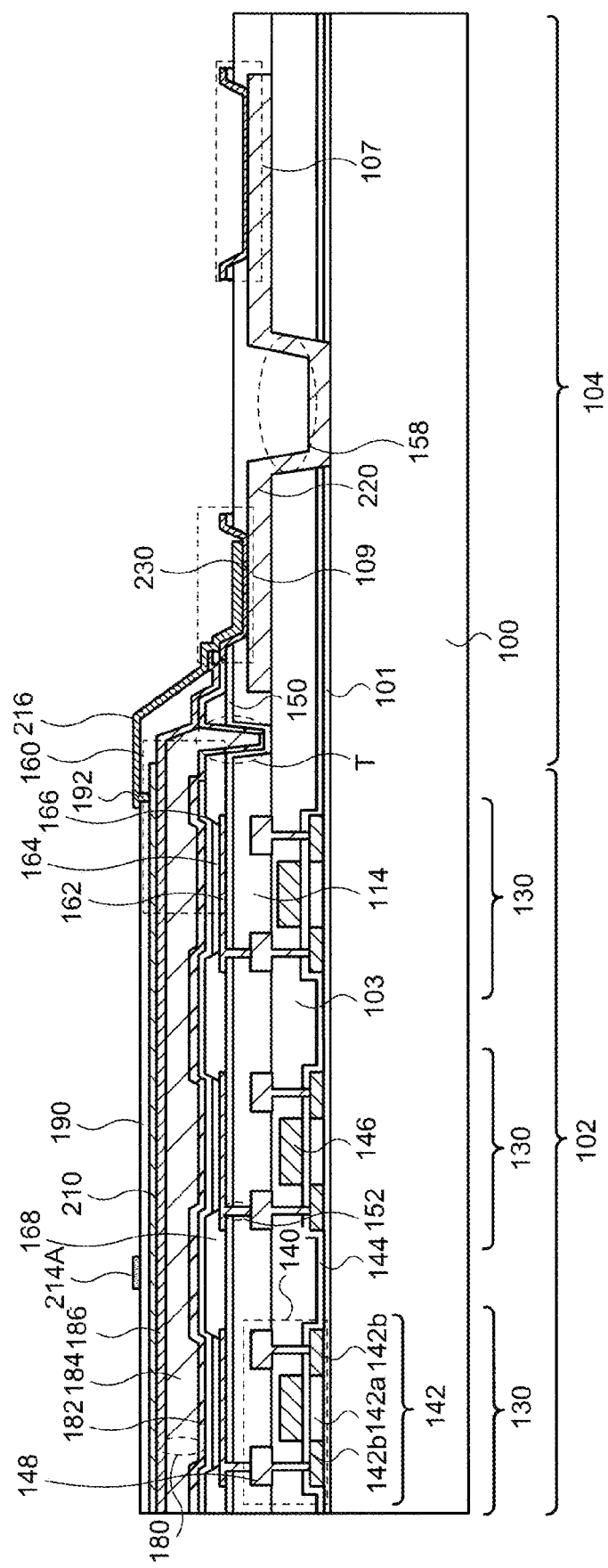
FIG. 18 is a cross-sectional view showing the seventh step of a process for manufacturing the display device according to an embodiment of the present invention.

FIG. 18 is a diagram for explaining the seventh step of the manufacturing process of the display device 10. The seventh step is to form the lead wiring 216 and the bridge member 214A on the interlayer insulating film 190. The lead wiring 216 is formed after the contact hole 192 is formed on the interlayer insulating film 190. The lead wiring 216 passes over the end of the oxide conductive layer 230 provided with the sealing layer 180 to electrically connect the sensor electrode 210 and the oxide conductive layer 230. The flexible printed board 106 is then affixed to the peripheral region 104 of the substrate 100 so as to be electrically connected to the terminal 109.

In the manufacturing process of the display device 10 described above, after the terminal wiring 220 is formed on the substrate 100, etching (e.g., dry etching) is performed a plurality of times. Even in this instance, since the oxide conductive layer 230 and 250 are provided on the terminal wiring 220, the terminal wiring 220 is not etched while being exposed. Therefore, the terminal wiring 220 is less likely to be damaged due to over etching. The lead wiring 216 extends over the sealing layer 180 and over the oxide conductive layer 230. Therefore, the lead wiring 216 is difficult to break.

<6. Modifications>

The above-described embodiments can be applied by combining or replacing each other. In the embodiment described above, it is also possible to carry out the present invention by modifying it as described below.

(First Modification)

Figure 19:
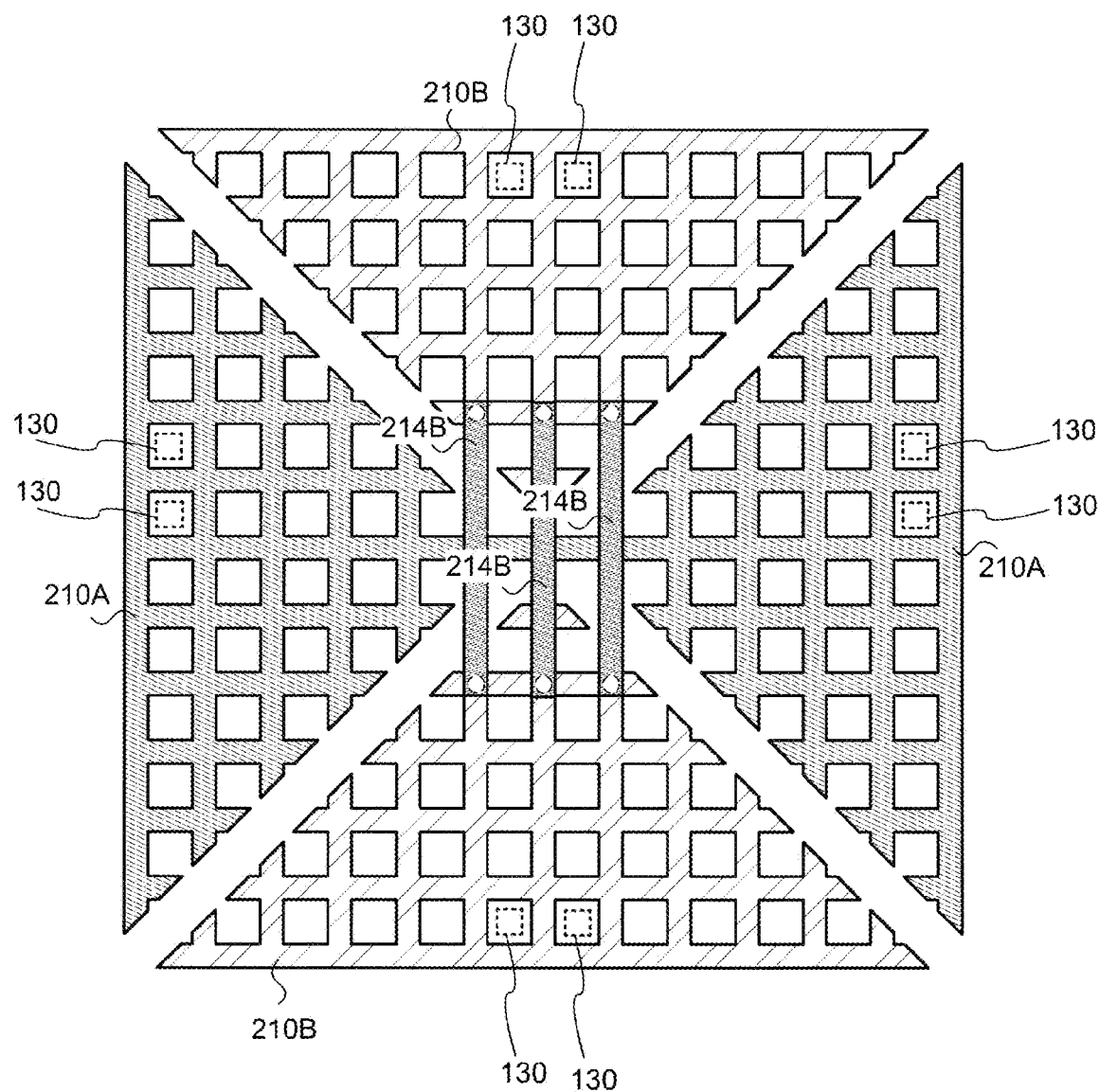
FIG. 19 is a top view showing a portion of a touch sensor according to a modification of the present embodiment of the present invention.

The first sensor electrode 210A and the second sensor electrode 210B may not be transparent electrodes. FIG. 19 is a top view showing a part of the touch sensor 20 according to this modification. Specifically, the first sensor electrode 210A and the second sensor electrode 210B are formed using a non-translucent material. The non-translucent material here is a low resistance metal material. The first sensor electrode 210A is metal film. The first sensor electrode 210A is formed in a mesh-like shape. The metal material is, for example, aluminum (Al). The metal material is not limited to aluminum (Al), and may be gold (Au), silver (Ag), copper (Cu), palladium (Pd), tungsten (W), or titanium (Ti).

The first sensor electrode 210A and the second sensor electrode 210B overlap the region between the two adjacent pixels 130 when viewed from the top of the display device 10. In the case of FIG. 19, the first sensor electrode 210A and the second sensor electrode 210B have an opening that overlaps the region between each and the two pixels 130 and overlaps the two pixels 130. This makes it difficult for the first sensor electrode 210A and the second sensor electrode 210B to prevent the light emitted from the pixel 130 from being transmitted to the outside of the display device 10. The wiring line width of the first sensor electrode 210A is, for example, several micrometers.

The two second sensor electrodes 210B adjacent to each other in the D1 direction are electrically connected to each other via the bridge member 214B.

The bridge member 214B is formed of the same material as the second sensor electrode 210B. The second sensor electrode 210B and the bridge member 214B may be formed physically integrally or separately. In the case of FIG. 19, although, the bridge member 214B is composed of three wirings extending in the D1 direction, may be composed of two or less or four or more wirings.

(Second Modification)

Part of the configuration described in the above embodiment may be omitted or changed. For example, some layers may be excluded, or other layers may be provided from the cross-sectional structure of the display device 10 illustrated in the figures. Also, the flexible printed board for driving the plurality of pixels 130 and the flexible printed board for driving the touch sensor 20 may be separately provided.

(Third Modification)

In the embodiment described above, the organic EL display device is exemplified as the disclosed example, but other application examples include: a Liquid Crystal Display Device.; other self-luminous display device; an electronic paper type display device having electrophoretic display element; and any flat-panel type display device.

Within the scope of the concept of the present invention, a person skilled in the art can conceive various changes and modifications, and it is understood that these changes and modifications also belong to the scope of the present invention. For example, with respect to each of the above-described embodiments, those skilled in the art may appropriately add, delete, or change the design of components, or may add, omit, or change the conditions of processes, as long as it has the gist of the present invention, it is within the scope of the present invention.

What is claimed is:

1. A display device comprising:
   a substrate;
   a display region arranged on the substrate and including a plurality of pixels;
   a first wiring provided on the substrate;
   an insulating layer overlapping a portion of the first wiring;
   an oxide conductive layer provided on the first wiring and electrically connected to the first wiring;
   a sealing layer overlapping the display region and sealing the plurality of pixels;
   a sensor electrode provided on the sealing layer and overlapping the display region; and
   a second wiring passing over at least a portion of an end of the oxide conductive layer provided with the sealing layer and electrically connecting the sensor electrode and the oxide conductive layer,
   wherein
   the sealing layer overlaps at least the portion of the end of the oxide conductive layer.

2. The display device according to claim 1, wherein the sealing layer includes at least one inorganic film.

3. The display device according to claim 1, wherein the sealing layer includes an opening above the oxide conductive layer, the sealing layer is provided so as to surround all ends of the opening to expose a surface of the oxide conductive layer in a region surrounded by the ends.

4. The display device according to claim 1, further comprising:
   a second insulating layer provided immediately below the second wiring.

5. The display device according to claim 4, wherein the second insulating layer includes a first opening exposing the oxide conductive layer, and
   an end of the sealing layer is provided between an end of the first opening and the display region.

6. The display device according to claim 1, further comprising
   a third wiring provided between the oxide conductive layer and the second wiring.

7. The display device according to claim 1, further comprising:
a flexible printed circuit board electrically connected to the first wiring, wherein the flexible printed circuit board drives the plurality of pixels and a touch sensor including the sensor electrode.

8. The display device according to claim 1, further comprising:
a second oxide conductive layer provided on the insulating layer and electrically connected to the first wiring; and
a flexible printed circuit board driving a touch sensor including the sensor electrode,
wherein
the sealing layer is further provided on at least an end of the second oxide conductive layer,
the flexible printed circuit board is provided on the end of the second oxide conductive layer provided with the sealing layer, and is electrically connected to the second oxide conductive layer.

9. The display device according to claim 1, wherein
the sensor electrode includes a first sensor electrode and a second sensor electrode, and the first sensor electrode and the second sensor electrode are insulated from each other and provided on the same insulating surface.

10. The display device according to claim 1, wherein
the insulating layer is a layer containing an organic material.

* * * * *